United States Patent
Kmetec et al.

[11] Patent Number: 5,867,324
[45] Date of Patent: Feb. 2, 1999

[54] SIDE-PUMPED LASER WITH SHAPED LASER BEAM

[75] Inventors: Jeffrey D. Kmetec, Los Gatos; Hai-Linh K. Nguyen, Milpitas, both of Calif.

[73] Assignee: Lightwave Electronics Corp., Mountain View, Calif.

[21] Appl. No.: 789,760

[22] Filed: Jan. 28, 1997

[51] Int. Cl.$^6$ ............................ G02B 27/10; H01S 3/091
[52] U.S. Cl. ............................................. 359/625; 372/71
[58] Field of Search .......................... 359/625; 372/71, 372/72

[56] References Cited

U.S. PATENT DOCUMENTS

| | | | |
|---|---|---|---|
| 4,127,828 | 11/1978 | Klauminzer | 331/94.5 |
| 4,199,735 | 4/1980 | Chadwick et al. | 331/94.5 |
| 5,103,457 | 4/1992 | Wallace et al. | 372/92 |
| 5,515,394 | 5/1996 | Zhang | 372/72 |
| 5,554,153 | 9/1996 | Costello et al. | 606/9 |
| 5,572,541 | 11/1996 | Suni | 372/70 |
| 5,590,147 | 12/1996 | Hobbs et al. | 372/75 |
| 5,643,252 | 7/1997 | Waner et al. | 606/9 |

FOREIGN PATENT DOCUMENTS

| | | | |
|---|---|---|---|
| 5-335662(A) | 12/1993 | Japan | 372/75 |

OTHER PUBLICATIONS

Ajer et al., "Efficient diode–laser side–pumped TEM$_{00}$–mode Nd:YAG laser," *Optics Letters*, vol. 27, No. 24, 1992, pp. 1785–1787.

Golla et al, "300–W diode–laser side–pumped Nd:YAG rod laser," *Optics Letters*, vol. 20, No. 10, 1995, pp. 1148–1150.

Walker et al. "Efficient continuous–wave TEM$_{00}$ operation of a transversely diode–pumped Nd:YAG laser," *Optics Letters*, vol. 19, No. 14, 1994, pp. 1055–1057.

*Primary Examiner*—Georgia Epps
*Assistant Examiner*—Ricky Mack
*Attorney, Agent, or Firm*—Charles S. Guenzer

[57] ABSTRACT

A solid-state laser having a rod of active material optically pumped along the side of the rod by an array of diode lasers. Beam shaping elements, such as Brewster angle facets on the end of the laser rod, cause the laser beam to assume a generally elliptical shape within the rod with the long axis of the ellipse aligned with the irradiation angle of the diode lasers. However, the beam is circularly shaped outside the rod. Preferably, the laser rod is held within an optical cavity formed within a cooling block which both cools the rod and reflects pump light back into the rod. The diode lasers irradiate the rod through a linear slit in the cooling block. Also, preferably, a slab-shaped optical waveguide is placed within the slit to guide the light from the diode lasers to the side of the laser rod.

20 Claims, 8 Drawing Sheets

SIDE-PUMPED LASER WITH SHAPED LASER BEAM

FIELD OF THE INVENTION

The invention relates generally to solid-state lasers and other non-linear optical devices, and in particular it relates to the confinement of pumping light and shaping of the laser beam within the lasing medium.

BACKGROUND ART

Optically pumped, solid-state lasers have long been known but continue to offer superior performance in many applications. Such lasers include an optically active medium, typically in the shape of a cylindrical rod, having multiple electronic energy levels. A high-energy optical source pumps the active medium of the rod so as to invert the population densities of the energy levels. The lasing radiation has energy defined by the differences between the energies of the inverted levels. Two mirrors define an optical cavity at least partially extending along the axis of the laser rod so that the lasing radiation grows and resonates within the cavity. The lasing medium then lases at a somewhat lower energy (longer wavelength) than that of the pump light. One of the mirrors is made partially transmissive so as to extract a fraction of the lasing light.

A semiconductor laser diode provides an efficient source of optical pumping light. It can very efficiently convert 30 to 45% of the electrical energy input to the diode to optical energy emitted as laser light from the diode. For very high intensity lasers, semiconductor laser diodes are available in linear arrays, referred to as diode bars, which are capable of providing very high intensity radiation. These bars are primarily composed of GaAlAs and emit light in the 800 nm region of the spectrum. As illustrated in plan view in FIG. 1, such a light diode bar 10 includes a large number of parallel laser stripes 12 formed on a common GaAs substrate 14. The large number of stripes 12 are arranged in smaller groups 16 with gaps 18 separating the groups 16. Each group 16 laterally extends over about 200 $\mu$m, and the entire light diode bar 10 laterally extends over about 1 cm and emits from a line 20 extending over nearly the same distance. The generally wedge-shaped light emission pattern from such a light diode bar 10 is illustrated isometrically in FIG. 2. In the vertical direction, the emission is diffraction limited from the approximately 1-$\mu$m high stripe and has a full vertical angle of 60°. On the other hand, the emissions from the groups 16 of laser stripes 12 have a full lateral angle of 10° extending outwardly from the relatively wide line 20 and they soon overlap, but this divergent beam still needs focusing in the far field if the source is widely separated from the point of use.

The use of bar diodes as sources of pump light has introduced a set of conflicts in coupling the pump light into the laser rod, particularly if two important engineering characteristics are to be achieved: highly efficient coupling between the pump and laser light; and the mode purity of the laser beam.

The coupling between the pump and laser light involves a process in which the coupling is proportional to the overlap between the radiation field of the pump light and the radiation field of the lasing light, itself resulting from the pump light. If the radiation field of the pump light, for whatever reason, does not coincide with the radiation field of the lasing light, the non-coinciding portion of the pump light is lost and the efficiency of the solid-state laser is decreased. Hence, if the desired laser beam is round, it is preferred that the pump light present a round distribution which matches the size of the laser beam.

A yet more fundamental problem arises from the need to stabilize the lasing modes of the solid-state laser. A large-scale solid-state laser tends to support, absent counter measures, a large number of modes, which for this discussion will be restricted to transverse modes. The fundamental mode in a circularly symmetric system is the $TEM_{00}$ mode, itself having two degenerate orthogonally polarized modes. This mode manifests a circular energy symmetry and a Gaussian energy distribution about the center of the rod. Higher-order modes, such as $TEM_{01}$, $TEM_{10}$, $TEM_{11}$, $TEM_{12}$, etc. have an azimuthal energy distribution introducing nodes into the optical distribution around the cross section of the rod. It is generally desired to restrict the lasing mode to the fundamental $TEM_{00}$ mode with only one linear polarization, excluding all of the others. This leads to the highest performance, diffraction-limited lasers.

An efficient laser design shows a preference for $TEM_{00}$ operation and has a pump light profile which has a substantial overlap with this mode.

At least two problems arise if higher-order modes are not suppressed. Higher-order modes have larger modal cross sections than the fundamental mode. If the output beam is to be focused to a spot, the higher-order radiation presents a larger virtual image of the laser source. Also, if the optical conversion efficiency in the laser rod is generally high, any pump light coupled into the higher-order modes lowers the amount of pump light available for coupling into the desired fundamental mode. That is, coupling into higher-order modes reduces the conversion efficiency into the fundamental mode.

There are basically two distinct ways of coupling pump light into a laser cavity, end pumping and side pumping.

In end pumping, as illustrated generally in FIG. 3, the diode bar 10 irradiates an optical system 26 that focuses the sheet-like or wedge-like bar beam 28 through an entrance mirror 30 so as to present a circularly symmetric beam onto a laser rod 32. An exit mirror 34 together with the entrance mirror 36 form an optical cavity about the laser rod 40. The exit mirror 34 is itself partially transmissive so that an output laser beam 42 is extracted from the cavity. This end-pumping configuration offers a number of advantages. Assuming that the beam of the pump light is circularly symmetric, the pump light both well overlaps the fundamental $TEM_{00}$ mode and also by its symmetry prefers the $TEM_{00}$ mode over other transverse modes. This configuration tends to be efficient if the length of the rod 40 is longer than the absorption length of the pump light, and if the pump light does not diverge substantially over the absorption length.

However, the end-pumped configuration has problems when a diode bar provides the pump light. The diode bar 10, as was described with respect to FIG. 2, inherently provides an optical source having vastly asymmetric characteristics across the two symmetric dimensions of the circular rod 40. Extra measures must be taken to convert the linearly extending output of the diode bar to the circularly symmetric pump favored for $TEM_{00}$ laser output.

Measures can be taken to create an asymmetric pump mode to match the asymmetry of the diode bar. For example, Wallace et al. disclose in U.S. Pat. No. 5,103,457 an end-pumped laser system having pumping beam-shaping elements, including Brewster angle prisms, disposed at the ends of the laser rod to convert the astigmatic pump light into a generally symmetric pump field in the active medium.

This effectively matches the circular laser mode to the asymmetrically shaped pump radiation. In any case, the optics required to create this mode-matching introduce undesired complexities despite the obvious advantages of the end-pumping geometry.

Additionally, the end-pumping geometry suffers from an inability to conveniently scale to high power levels. Since the mode matching must occur with optical beams that are typically only 0.5 mm in diameter, it becomes very difficult to concentrate large amounts of power into such a small spot. Normally, only 15 to 20 W of pump power can be so tightly focused. This high intensity of pump light also incurs severe materials limitations, as the heat load causes strong distortions in the laser medium. Common laser materials, such as Nd:YAG, Nd:YLF, and Nd:YVO$_4$ all reach their operational limits in this power range. Their operation is limited by fracture, aberrated thermal lensing, stress birefringence, and other strain-optical effects.

The alternative geometry is side-pumping in which, as illustrated in the isometric view of FIG. 4, the line 20 of the diode bar 10 is aligned with an axis 43 of the laser rod 40, and the optical output of the diode bar irradiates the longitudinally extending side of the laser rod 40. This geometry has several advantages in matching the linearly extending bar diode 10 with the linearly extending laser rod 40. There is no need to focus the optical output of the diode bar 10 in the direction along the longitudinal axis 42 of the laser rod 40. Even focusing circumferentially of the laser rod may not be required if the diode bar 10 can be brought close enough to the laser rod 40 so that its beam 44 irradiates only a small portion of the circumference of the rod. As a result, the pump entrance optics may be considerably simplified. The number of diodes may be increased to thereby increase the total laser output since the length of the laser rod is not fundamentally constrained. Additionally, thermal limitations of the laser material are not encountered in the 5 to >100 W output range because the pump light is distributed over a greater amount of laser crystal than in the case of end-pumping.

However, the side-pumped configuration has fundamental geometric disadvantages, especially for a cylindrically shaped laser rod. For highly efficient coupling, the bar diode 10 is positioned relatively closely to the laser rod 40 with the result that a generally wedge-shaped beam 44 irradiates a central plane of the laser rod 40. Generally, it is desired to produce a circularly shaped laser beam since other shapes typically having higher-order components that are difficult to optimize with normal optics. Also, the simple structure of FIG. 4 requires a trade off between increasing coupling efficiency by making the absorption length of the pump light shorter than the rod diameter and increasing pumping uniformity by making the absorption length longer.

The uniformity problem can be significantly reduced by coating the portions of the cylindrical sidewall of the laser rod, not including where the pump beam 44 initially strikes, with a highly reflective coating, as has been described by Ajer et al. in "Efficient diode-laser side-pumped TEM$_{00}$-mode Nd:YAG laser," *Optics Letters*, vol. 27, no. 24, 1992, pp. 1785–1787. If diode bar 10 is brought close to the laser rod 40, the incident aperture not covered by the reflective coating is relatively small. Thereby, the pump light is substantially trapped within the laser rod 40, with the subsequent passes across the rod tending to circularize the pump field within the rod. Ajer et al. further increase the circularity of the pump field by positioning two such laser bars 10 along the laser rod but oriented circumferentially at positions offset by 90° with respect to the rod center. They reported that their structure provided a coupling efficiency of 27% in pulsed operation and a circular, TEM$_{00}$ laser beam. However, their structure did not accommodate any heat sinking of the laser rod and is thus subject to deleterious thermal effects if CW operation were to be attempted.

One of the present inventors, Kmetec, has suggested in U.S. patent application Ser. No. 08/268,781, filed Jun. 30, 1994, herein incorporated by reference in its entirety, a particularly advantageous configuration for a side-pumped solid-state laser. Other art is available for many of the features of Kmetec, including U.S. Pat. No. 5,572,541 to Suni. As illustrated in the axial cross-sectional view of FIG. 5 and in the isometric view of FIG. 6, the laser rod 40 is embedded in a cylindrical cavity in a solid block 50 of copper or other highly thermally conductive material, and the rod 40 tightly contacts the copper block 50 to provide good thermal conductance. A surrounding surface 52 of the cylindrical cavity is coated with gold or other highly reflective material so as to reflect light with high efficiency. A linear slit 54 is formed between the cylindrical cavity and the exterior of the copper block 50 and is sized to closely accommodate the 60° vertical emission angle from the stripe 20 of the diode bar 10 with perhaps a few reflections within the slit 54. The diameter of the rod 40, that is, its dimension along the pump incidence direction, is preferably a small fraction, e.g. less than ½, of the absorption length of the pump light within the rod 40, which low absorption is in direct contrast to the conventional practice for side-pumped lasers. As a result, light emitted from the diode bar 10 through the slit 54 traverses the laser rod 40 many times as it is multiply reflected by the sides 59 of the slit 54 of the gold-coated copper block 50. The cylindrical cavity of the copper block 50 serves as an optical trap so that all the incident light, minus any reflectivity losses at the gold coating at the surrounding surface 52 and any back reflections through the slit 54, is absorbed by the laser rod 40.

Even with the nearly optimal optical absorption, the lasing medium in the rod is not totally efficient, and a large fraction of the absorbed optical pump power is dissipated as heat. The configuration of FIGS. 5 and 6, however, allows effective thermal coupling by thermal conduction between the laser rod 40 and the copper block 50, which, besides having a large thermal mass, is mechanically and thermally fixed on a mount 55 that is heat sunk to cooling means, examples of which are chilled water, refrigeration systems, thermoelectric coolers, or finned radiators. Such efficient thermal conduction is especially important for laser rods generating 1 W or more of laser power.

Nonetheless, the side-pumping configuration presents some fundamental problems. The intrinsic problem is that the pump field is necessarily non-uniform across the circular rod. The reflectance from the walls of the circular cavity is somewhat less than unity; a 5% loss per reflection is considered good. If the pump-to-active coupling efficiency is to be kept high by keeping the absorption per pass substantially above the wall loss, then the resultant pump field tends to be distinctly asymmetric. As illustrated in the axial cross section in FIG. 7, the laser bar 10 irradiates the laser rod 40 with a beam 53 propagating along a central optical axis 56 assumed to intersect the center of the rod 40. The figure includes a number of items related to the invention to be described later. The beam 53 has a full Gaussian angular width in the width direction of the slit 54 of about 60° in free space, but the width is substantially less inside the high-index laser rod 40, about 32° full width for YAG, with the strongest portions significantly nearer the optical axis 56. The first few passes of rays of the 60° divergent beam 54 through the rod 40 are schematically illustrated in FIG. 7. The effective pump field can be approximated by a cross-sectional area 58 in the general form of an ellipse. The major axis of the ellipse extends along the optical axis 56 of the beam 53 from the laser bar 10 and may be large enough to approximately equal the diameter of the rod 40; however, the minor axis of the ellipse, transverse to the major axis, is substantially less than the rod diameter. The elliptical shape of an effective pump field is only an approximation to the real non-uniform field, which undoubtedly has higher order terms. But, based on the experimental results discussed below, the elliptical field appears to be a reasonable approximation.

Kmetec attempts to circularize the pump field within the laser rod 40 by enhancing the scattering of the pump light on reflection so as to more completely randomize the pump light, but this never completely circularizes the field and further introduces additional constraints on the design. Kmetec further attempts to remove the flattened pump field by using multiple diode bars aligned at different azimuthal angles about the laser rod, for example, three bars separated by 120° between any pair. While this approach removes some of the non-circular components, it can leave nodes in the pump pattern. Furthermore, the geometrically determined multiplicity of laser bars constrains the design, and the different angles introduces a large, complex mechanical structure.

Fujino discloses a design similar to the above described features of Kmetec et al. in Japanese Laid-Open Patent Application 5-335662. Golla et al. disclose in "300-W diode-laser side-pumped Nd:YAG rod laser," *Optics Letters*, vol. 20, no. 10, 1995 an extension of the azimuthal arrangement of multiple diode bars. They position eighteen diode laser arrays in a 9-fold symmetry, and a separate reflector is positioned on the opposite side of the laser rod from each diode laser array. This arrangement produces a pump field that was highly concentrated around the axis of the laser rod, even more highly than that of Fujino. The rod is heat sunk in a flow tube, and thermal effects become significant above about 400 W of pump power. Walker et al. disclose a somewhat similar side-pumped laser in "Efficient continuous-wave $TEM_{00}$ operation of a transversely diode-pumped Nd:YAG laser," *Optics Letters*, vol. 19, no. 14, 1994, pp. 1055–1057. They use reflective optics to focus the pump light at the central axis of the pump rod, thus producing a highly concentrated pump field.

The elliptical pump field 58 is obviously not well matched to a circularly symmetric laser field and hence the radiation coupling efficiency is less than ideal.

Hobbs et al. in U.S. Pat. No. 5,590,147 disclose a different approach of matching the laser beam to the pump field. They arrange two arrays of laser diodes on opposed sides of a flattened laser rod and focus the light into the rod, to thus create a sheet-shaped pump field in the rod. They then use optics at the two ends of the rod to pass the laser beam multiple times through the pump field but at positions arranged along the pump irradiation direction. Thereby, a round laser beam is better matched along its entire length to the pump field.

Zhang in U.S. Pat. No. 5,515,394 teaches the importance of beam shaping both in side-pump and end-pumped lasers. In all his embodiments, he uses a slab-shaped laser body (rectangular body having sides of substantially different sizes), and uses optics between the diode bars and the slab to produce a sheet-like pump field in the laser slab. In his end-pumped laser, prisms at one end of the laser slab shapes the laser beam to better conform to the sheet-shaped pump field. Thus, Zhang's use of laser beam shaping is predicated upon his flattened rectangular laser body, and the highly collimating optics disposed between the pump source and the laser body.

A further problem with the slotted heat sink of Kmetec is the limited access of the diode bar radiation through the slit and into the laser rod. Kmetec teaches allowing the diode beam 53 to multiply reflect off the walls 59 of the slit 54 before it reaches the laser rod 40. Suni in U.S. Pat. No. 5,572,541 shows a similar light-guiding slit within a heat sink. Generally, in these structures the slit depth should be relatively short so that the 60° vertically divergent radiation reaches the laser rod with only a few reflections from the slit walls. Kmetec recommends coating the slit walls 59 with gold or other reflective materials, but smoothly forming and coating a narrow slit is difficult and the overall limitation on slit length remains. A slit of relatively shallow depth means that the heat-sinking medium surrounding the rod 40 is distinctly asymmetric near the slit 54, thus introducing thermal gradients around the circumference of the rod 40. On the other hand, for better optical coupling, the number of reflections from the slit walls 59 can be reduced by increasing the width of the slit 54 or by decreasing its depth, but an increased slit width or a decreased slit depth only exacerbates the thermal and optical asymmetries associated with the slit. Overall, the optimal slit for thermal uniformity is small in width and large in depth while the optimal slit for optical coupling the slit is large in width and small deep in depth. Obviously, the two considerations are incompatible in the prior art.

SUMMARY OF THE INVENTION

The invention can be summarized as a side-pumped laser having a laser rod in which the laser field within the rod is shaped to more closely conform to the shape of the pump field. The pump field tends to have a nearly elliptical shape. Beam shaping means, such as a Brewster-angle facet on the end of the laser rod, shapes the laser beam into, for instance, an elliptical shape, preferably with a low ellipticity ratio. The major axis of the ellipse corresponds generally to the direction along which the pump light strikes the laser rod. An additional advantage of a Brewster-angle facet is that it provides a perfectly transmissive window for one of the beam's polarization angles.

A preferred embodiment of the invention includes a linear array of laser diodes integrated into a laser bar as the pump source. The array is arranged in parallel with the axis of the laser rod and irradiates the laser rod through a linearly extending slit in the heat sink. The laser rod is closely held within a cylindrical cavity in the heat sink with the slit juxtaposed to the side of the rod. The cavity of the heat sink is coated to have high reflectivity to multiply reflect the pump light.

In another aspect of the invention, a slab waveguide of high refractive-index material is inserted into the slit of the heat sink. One side of the slab waveguide is closely adjacent to the optical output of the diode laser, and the other side is aligned with the center of the side of the rod or other optically active body. The slab waveguide presents a very narrow slit entrance to the output of the diode, yet the diode light can propagate nearly loss-free through a very deep slit. The slab waveguide allows the width of the slit required to introduce the diode light to be minimized while it also allows the depth of the slit to be increased to improve the thermal symmetry about the laser rod. The slab waveguide can be constructed with thermally conductive transparent media such as clear YAG or sapphire, further enhancing the thermal symmetry.

DETAILED DESCRIPTION OF THE PREFERRED EMBODIMENTS

The coupling between the pump field and the laser field is improved if the pump field is allowed to assume a distinctly asymmetrical shape, thus providing a shaped optical gain region, preferably a generally elliptically shaped region. Then, the laser beam is shaped to optimally overlap the optical gain region, thus extracting the most amount of power in a diffraction-limited output beam external of the laser rod.

As discussed above, side pumping in a laser produces a transversely asymmetric, generally elliptical, pump field across the cross section of the laser rod. According to this aspect of the invention, the beam propagating along the axis of the rod is shaped to generally conform to the shape of the pump field.

Pump energy absorbed in a spatial region that is not overlapped by the diffraction-limited laser beam not only reduces efficiency, but also encourages the lasing of higher-order transverse modes. If the non-overlapped region contains an appreciable amount of absorbed energy, it may be very difficult to force the laser to oscillate in only the diffraction-limited fundamental Gaussian mode. Hence, the ability to achieve a good overlap is the key to efficient side-pumped lasers, and the performance of the invention described here substantially exceeds that of the prior art. Preferably, the distorted beam shape within the rod is transformed to a nearly circular shape outside of the rod so as to provide a diffraction-limited output beam of the fundamental transverse mode.

Figure 7:
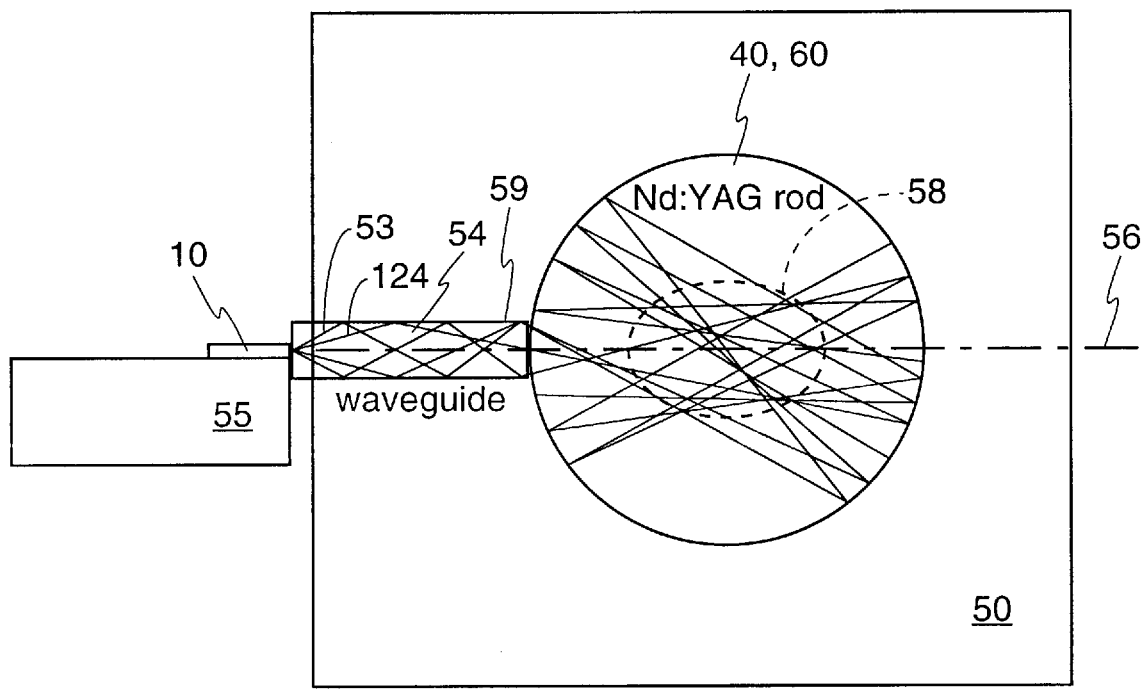
FIG. 7 is a schematic cross-sectional view of the pump light field produced in a side-pumped laser.

In a general preferred embodiment explained in reference to FIG. 7, the shape of the laser beam within a laser rod 40 is made to conform to the elliptical cross-sectional area 58 generally corresponding to the pump field. It is understood that the major diameter of the laser beam need not equal the diameter of the laser rod 40 but may be somewhat less. The matching of the minor diameter of the laser beam to the extent of the pump field is believed to be more critical. The beam shaping of the invention can be accomplished in a number of ways.

Figure 5:
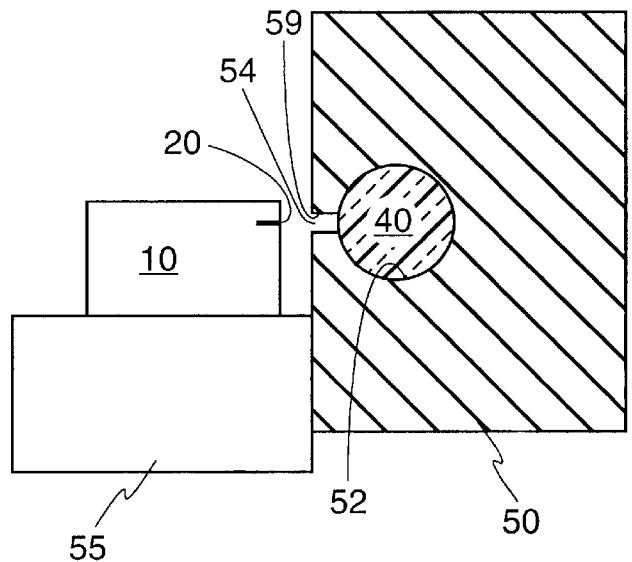
FIG. 5 is a cross-sectional view of a heat-sunk, side-pumped light engine.
Figure 6:
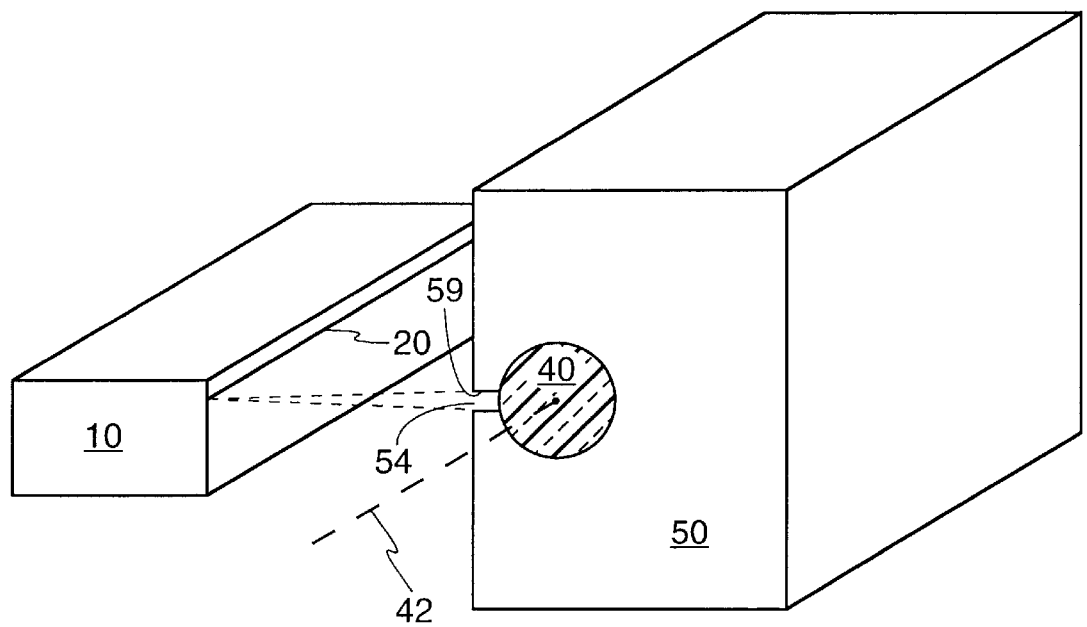
FIG. 6 is an isometric view of the light engine of FIG. 5.

In the simpler embodiment, there is no waveguiding optics on the pumping side, just as in FIG. 5. As illustrated in FIG. 7, the diode bar 10 is positioned closely to and its emission pattern aligned with the slit 54 in the heat sink 50 so that its diverging vertical pattern 53 is accepted by the slit and reflects a few times from the slit walls 59. There are no free-standing focusing optics between the diode bar and the slit 54 or the laser rod 40. It has been found that the 60° vertical emission angles typical with commercially available bar diodes well matches an elliptically shaped laser beam of moderate ellipticity without the need for intermediate focusing optics.

It should be mentioned however that an elliptical laser beam is not severely distorted from a circular laser beam. Both can be considered to be TEM$_{00}$ with a renormalization of the orthogonal axes. If an elliptical laser field is beam-shaped into a circular field on the exterior of the laser rod, normal mode-control means can be applied to restrict the laser radiation to a single lowest-order transverse mode. Additionally, the laser produces the desired round output beam. This beam shaping, or mode selection, is traditionally conducted with circular apertures. It is more effective to have the available optical gain only present within the desired spatial shape of the lasing optical mode and not discard light at the aperture. This does not refer to the outer shape of the laser medium, but to the actual pattern of the absorbed pump light within the medium. In this situation, those transverse modes which match the shape of the gain have the highest observed gain and are selected as the strongest transverse modes. Hence, a circular or an elliptical gain region is well suited to the creation of circular or elliptical beams respectively. Since elliptical beams can be transformed into the desired circular ones, they are similarly attractive.

Figure 8:
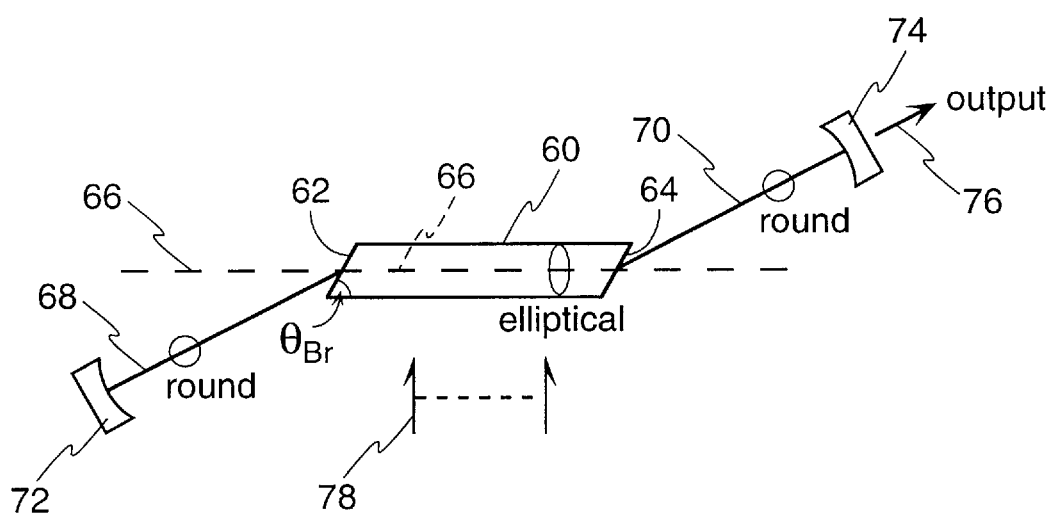
FIG. 8 is a schematic cross-sectional view of a Brewster-angled rod of the invention.

The preferred technique for beam shaping involves inclining one or both of the ends of a laser rod 60, as illustrated in FIG. 8, into facets 62, 64 inclined at or near the Brewster angle $\theta_{Br}$ with respect to an optical axis 66 extending longitudinally along the center of the rod 60. The lasing light outside of the rod 60 follows respective free-space paths 68, 70 and are incident onto two spherically or hyperbolically shaped focusing mirrors 72, 74. An optical cavity is thus formed along optical path 68, 66, 70 between the mirrors 72, 74 and including the laser rod 60. The output mirror 74 is partially transmissive so as to pass an optical output beam 76. A sheet-like beam 78 of pump light from the laser bar irradiates the side of the Brewster rod 60 in a direction along which the end faces 62, 64 are inclined. Preferably, within the rod 60 along the rod axis 66, the laser beam is elliptically shaped in the axial cross-section of the bar with its major axis extending along the direction of the sheet-like beam 78; while outside the rod 60 along the free-space paths 60, 70, the laser beam is circularly shaped.

It is well known to shape the ends of laser rods at the Brewster angle based upon considerations of transmissivity and polarization. Radiation linearly polarized in the plane of Brewster-angled facet, the "p" polarization, is completely transmitted through the interface while the orthogonally polarized radiation suffers some reflection loss. Thus, Brewster-angled facets decrease the loss for one polarization and increase it for the other so as to produce an efficient single-polarization optical cavity.

Figure 9:
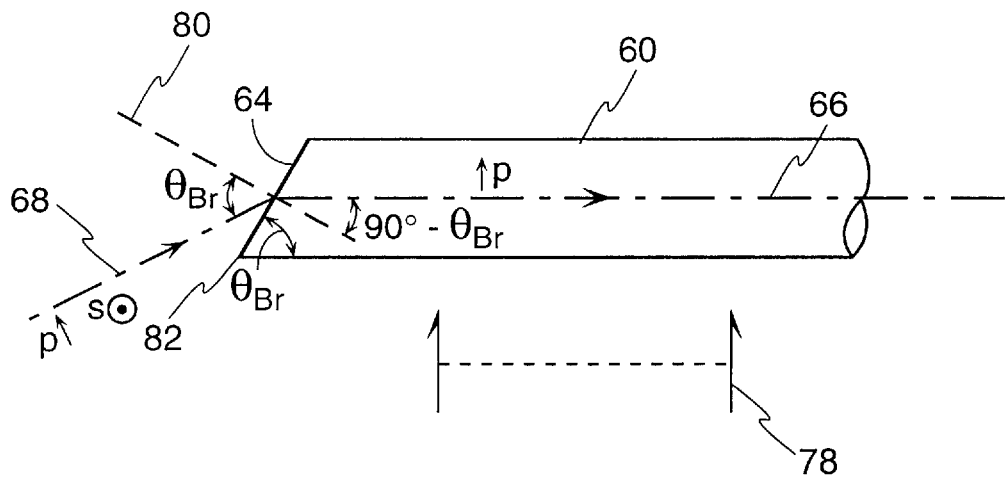
FIG. 9 is a schematic cross-sectional view of an optical arrangement a Brewster-angled faces of the rod to provide beam shaping.

An end of a Brewster-angled rod 60 is schematically illustrated in FIG. 9. The cylindrical rod 60 has an index of refraction n, and its angled facet 64 is assumed to be exposed to vacuum, although air and most other gases may be substituted for the vacuum with substantially no change and the theory is easily extendible to a more general interface. The surface of the facet 64 has a normal 80 that is inclined at an angle $90°-\theta_{Br}$ with respect to the rod axis 66, where $\theta_{Br}$ is the Brewster angle defined by $$\tan \theta_{Br} = n. \tag{1}$$

Alternatively stated, the Brewster-angled facet 64 has an apex 82 at which the surface of the facet 64 is inclined at the Brewster angle $\theta_{Br}$ with respect to the rod axis 66. If light propagates along the input beam 68 to strike the angled facet 64 at the Brewster angle $\theta_{Br}$ with respect to the facet normal 80, that light is refracted according to Snell's Law along the rod axis 66. Importantly, light polarized within the plane of the illustration, that is, the "p" polarization, with a component along the inclination direction, is perfectly transmitted across the interface at the Brewster-angle facet 64 with no reflection while the orthogonal "s" polarization extending out of the illustrated plane and lying within the plane of the facet 64 is only partially transmitted. The reflected portion propagates along another direction besides the optical cavity path 68, 66, 70, and is lost out of the optical cavity. The same characteristics are obtained when light is propagating from right to left along the axis 66 within the rod 60 and is refracted into the output beam 68.

The refractive index n for YAG equals 1.82 so that its Brewster angle, as defined above, is 61.2°, and the rod face 64 is cut at 28.8° with respect to the perpendicular to the rod axis 66.

Figure 10:
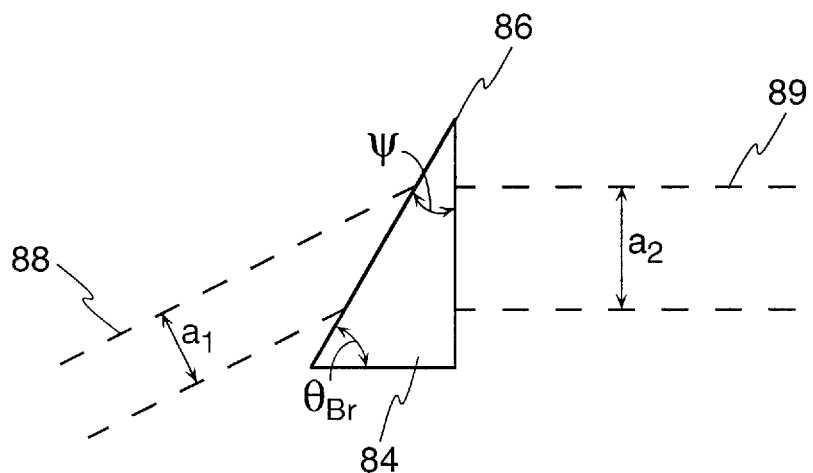
FIG. 10 is a schematic cross-sectional view of an optical arrangement of a prism providing beam shaping and magnification.

A related geometry, illustrated in FIG. 10, includes a prism 84 composed of an optical material of refractive index n and having an apex angle 86 of $\psi$. For Brewster-angle operation, the apex angle $\psi$ is equal to $90°-\theta_{Br}$ but other angles may be used for selected magnification. The prism 84 couples a first beam 88 having a diameter $a_1$ in the plane of the illustration to a second beam 86 having a corresponding diameter $a_2$. The prism 84, similarly to the Brewster rod 60, acts to magnify the first beam diameter $a_1$ into the second beam diameter $a_2$ by a magnification factor M equal to $$M = \frac{a_1}{a_2} = \frac{\sqrt{1 - n^2 \sin^2 \psi}}{\cos \psi}. \tag{2}$$

If the first beam 88 is incident on the sloping face of the prism 80 at the Brewster angle with respect to the face normal, then the magnification is equal to the refractive index, $$M = n. \tag{3}$$

On the other hand, in the direction perpendicular to the plane of the illustration, the prism 84 does not affect the beam dimension. Hence, assuming that the first beam 88 is circularly shaped with a diameter $a_1$, the second beam 89 is elliptically shaped with a minor axis equal to $a_1$ and a major axis equal to $a_2$.

The same theory of magnification and ellipticity may be applied to faceted ends of the laser rod.

Returning to FIG. 8, if the radiation is circularly shaped along the free-space paths 68, 70, then it is elliptically shaped in the Brewster-angled rod 60. Thus, the refractive index n equals the ellipticity e of the beam within the rod 60, 1.82 for YAG. The circular beam shaping external of the rod 60 can be accomplished by placing a small circular aperture adjacent to the focus point of one or both of the spherical mirrors 74 having a size only slightly larger than the fundamental mode. Ideally, the elliptical gain region naturally produces a round $TEM_{00}$ mode external to the rod such that no other apertures are needed.

In a variation of the first embodiment, the ends 62, 64 of the laser rod 60 are cut for an angle other than the Brewster angle. An end coating is used to eliminate residual Fresnel reflections to create a low-loss optical cavity. The angle of the ends 62, 64 is chosen such that the beam shaping, circular to elliptical, is optimized for the laser rod. Varying the angle of the rod end results in variations in the expansion of the circle into an ellipse.

Figure 11:
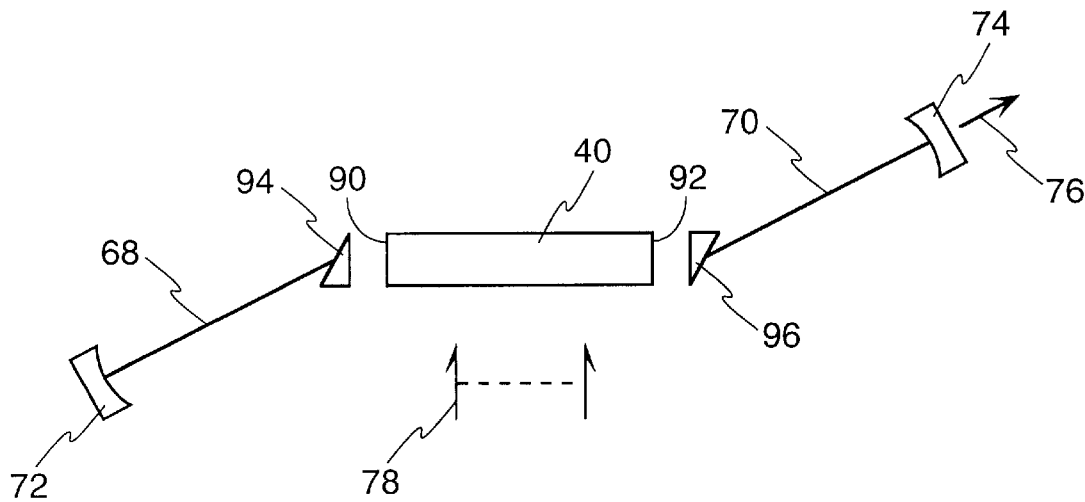
FIGS. 11 and 12 are schematic cross-sectional views of systems using a prism used to change a round beam into an elliptical beam, according to the invention.

In a second general embodiment as illustrated in FIG. 11, the standard cylindrical laser rod 40 is used with the ends 90, 92 of the rod 40 cut for normal incidence operation. That is, the rod faces 90, 92 have normals parallel to the axis 43 of the rod 40. The faces 90, 92 are anti-reflection coated, as is standard practice. However, beam-shaping optics, either prisms or cylindrical lenses or mirrors, are used to present an elliptical beam to the laser rod 40, while allowing the laser beam to be round at the laser output 76. This variation can readily produce the 1:1 (circular) to 1:3 ellipticity ratio range relevant for this invention.

A sub-embodiment is illustrated in FIG. 11 in which the standard squared-ended laser rod 40 is disposed between two prisms 94, 96. Preferably the apex angles of the prisms 94, 96 may be varied from the Brewster condition for more controlled beam shaping. The sheet pump beam 78 is incident along the slope direction of the prisms 94, 96, the direction corresponding to the major axis of the elliptically shaped beam internal to the laser rod 40.

Klauminzer in U.S. Pat. No. 4,127,828 discloses the use of prisms for beam shaping for a different type of laser involving a dye cell and a large diffraction grating.

In a yet further sub-embodiment, still referring to FIG. 11, one of the facets 90, 92 is coated to be reflective to form one end of the optical cavity, thus eliminating the need for the associated beam shaping equipment and spherical mirror. If the left-hand facet 90 is so coated to be as reflective as possible, the mirror 72 and prism 90 are not used. Of course, the square reflective rod end may be combined with other forms of beam shaping at the other end, such as the Brewster-angle facet 64.

Figure 12:
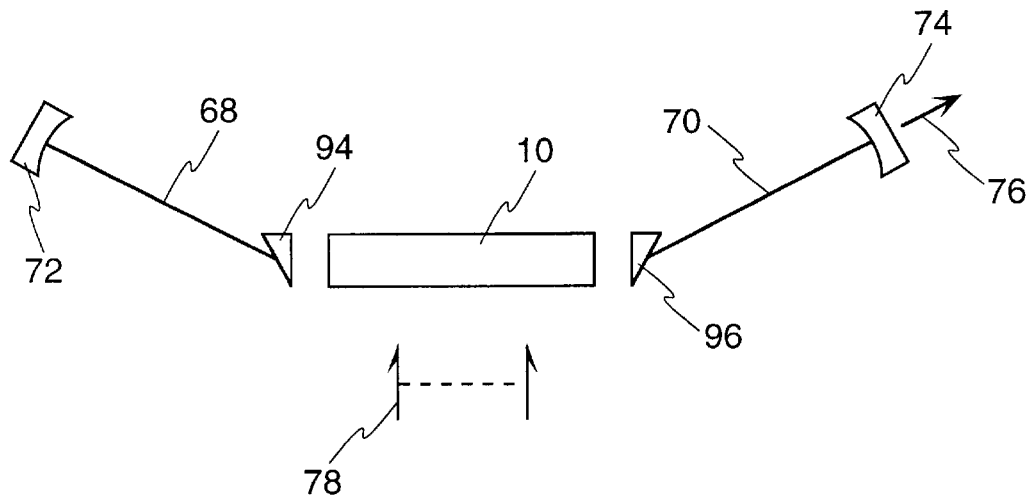

A variant of this embodiment, illustrated in FIG. 12, inverts the orientation of one of the prisms 94, 96 so that the two free-space paths 68, 70 are no longer parallel.

Figure 13:
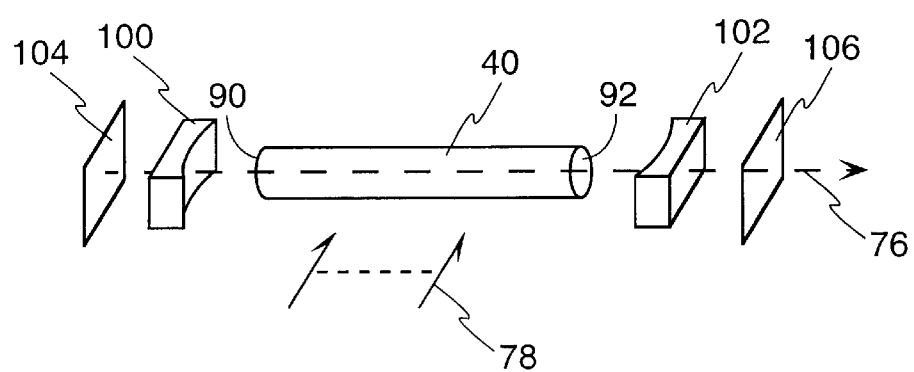
FIG. 13 is a schematic cross section of a system using anamorphic optics to provide the beam shaping of the invention.

The beam shaping can be accomplished by any other known optical means that elongate the beam cross section within the laser rod. For example, as illustrated in FIG. 13, the laser rod 40 with square ends 90, 92 is disposed between two anamorphic refractive lens systems 100, 102. These astigmatic refractive lens systems are illustrated as being concavely cylindrical, but they may be much more complex incorporating other focusing functions so as to allow the use of two planar end mirrors 104, 106. Furthermore, although concave lenses are illustrated, convex lens systems can be used with a change in 90° in their axes. In either case, the astigmatic optics convert a circularly shaped beam external of the rod 40 to an elliptically shaped beam inside of the rod 40 with the major elliptical axis extending along the direction of the sheet pump beam 78. Anamorphic reflective optics may be used in place of the illustrated anamorphic refractive optics in which the relative difference in magnification along the two cross-sectional directions of the laser rod are accomplished by curved reflective surfaces.

Figure 14:
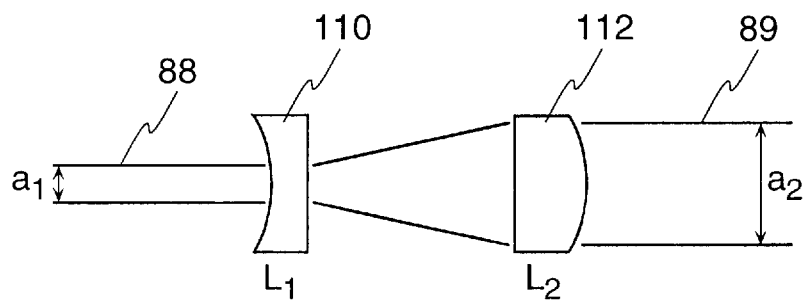
FIGS. 14 and 15 are cross-sectional views of cylindrical lens systems used to provide beam shaping between an active medium and the surrounding optics.
Figure 15:
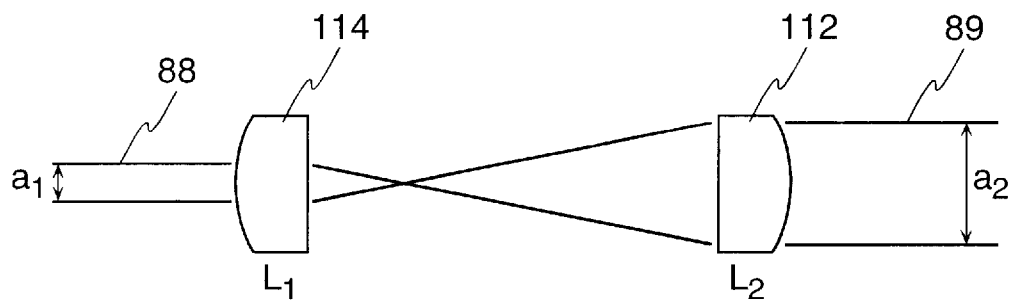

Two examples of cylindrical optics are illustrated in FIGS. 14 and 15. In FIG. 14, the first beam 88 of dimension $a_1$ is incident on a concave cylindrical lens 110 of focal length $L_1$ while the second beam 89 of dimension $a_2$ is incident on a convex cylindrical lens 112 of focal length $L_2$. In FIG. 15, the optics differ in that the first beam 88 is incident on a convex lens 114 of focal length $L_1$, and the two lenses 112, 114 are separated approximately by their combined focal lengths $L_1+L_2$. In both cases, the magnification is given by $$M = \frac{L_2}{L_1} . \tag{4}$$

Again, if the beam is circularly shaped outside of the rod 40, the ellipticity e of the beam within the rod 40 is equal to the magnification M.

It is to be appreciated that the magnification factor M may be less than unity. In particular, one dimension of an external beam may be shrunk inside the laser rod to produce a minor axis of a laser beam field that is perpendicular to the incidence direction of the pump light. Typically, however, the laser rod is larger than the beam in vacuum so that the positive magnification described in the detailed embodiments is used.

When the beam shaping is performed by optics not integrated with the laser rod, it is possible to place the beam shaping optics on the output path of the laser beam outside of the optical cavity defined by the end mirrors. As a result, the lasing beam shape inside the cavity is determined primarily by the laser pump field while the external shaping optics shapes this generally elliptical internal beam to a more circular external beam. This approach, however, has the disadvantage of matching the external correction to the elliptical mode of the laser cavity. While this is possible, it is preferable that the cavity directly produces a round beam.

Figure 16:
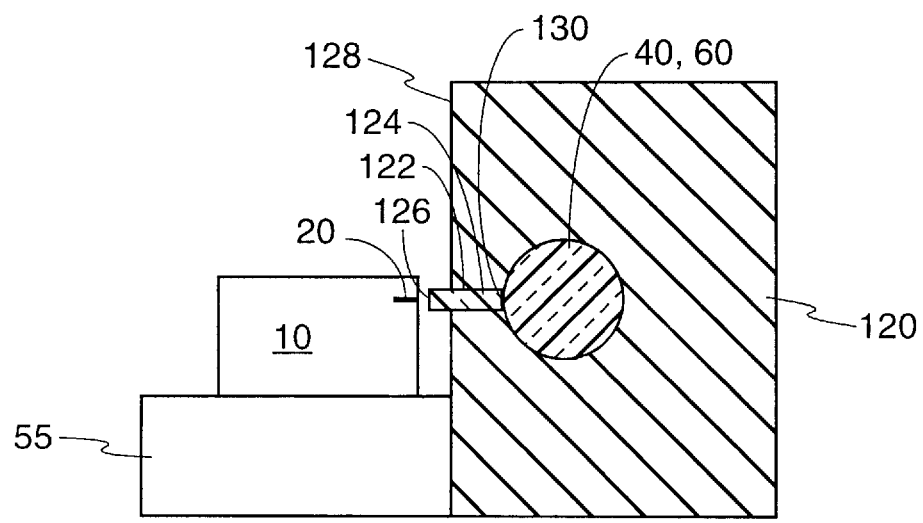
FIG. 16 is an isometric view of a heat-sunk side-pumped laser engine incorporating an optical waveguide to couple the diode light into the laser rod.

Another aspect of the invention addresses coupling the linear pump radiation to the rod, which is substantially enclosed within the heat sink. As illustrated in the cross-sectional view of FIG. 16, the laser rod 40, 60 is embedded in a modified heat sink 120 having a significantly longer slit 122. A slab waveguide 124 is fit into the slit 122 and has an outer end 126 preferably projecting somewhat beyond a face 128 of the heat sink 120 into which the slit 122 is machined. The line 20 of the laser bar 28 is aligned and closely adjacent to the outer end 126 of the slab waveguide 124. The close positioning of the diode bar 10 to the slab waveguide 124 allows the efficient coupling of the pump light into the slab waveguide 124 without the use of separate intermediate optics. However, it is possible to shape the end of the slab waveguide 124 facing the diode bar 10 into the form of a cylindrical lens so as to adjust the divergence angle of the light traversing the slab waveguide 124 and entering the laser rod 40, 60.

The slab waveguide 124 is a rectangular solid having a substantial dimension extending along the axis of laser rod 40, 60 so as to confront the entire emission line 36 of the laser bar 28. Its width, as illustrated vertically, is preferably kept small while its length in the horizontally illustrated direction may be relatively long. The slab waveguide 124 is preferably formed of an optical glass with a fairly high refractive index so as to adequately waveguide the light propagating from the laser bar 10 to the laser rod 40, 60 and with a low optical absorption at the wavelength of the pump light. Alternatively, the slab waveguide may be formed of a material exhibiting both reasonable refractive index and thermal conductivity, for example, undoped YAG or sapphire. Thereby, the thermal asymmetry around the slit is further reduced. The large lateral sides of the slab waveguide 124 are preferably polished so as to promote the waveguiding and reduce any interface scattering.

An optical cement can be used to rigidly mount the slab waveguide 124 within the slit 122, but it must have a refractive index less than that of the waveguide 124. An index-matching material may be included between an inner end 130 of the slab waveguide 124 and the laser rod 40, 60 so that the waveguided light is effectively coupled into the laser rod 10, 60.

Figure 1:
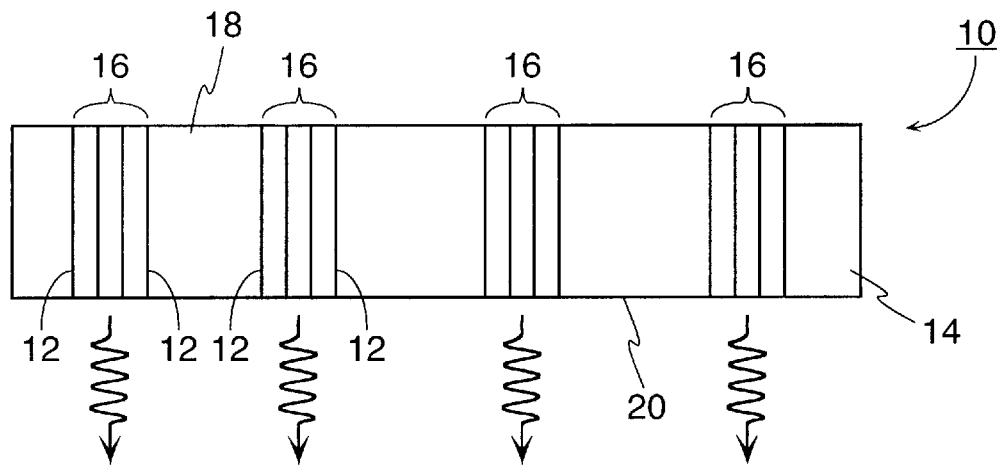
FIG. 1 is plan view of a conventional diode bar incorporating a linear array of diode lasers.
Figure 2:
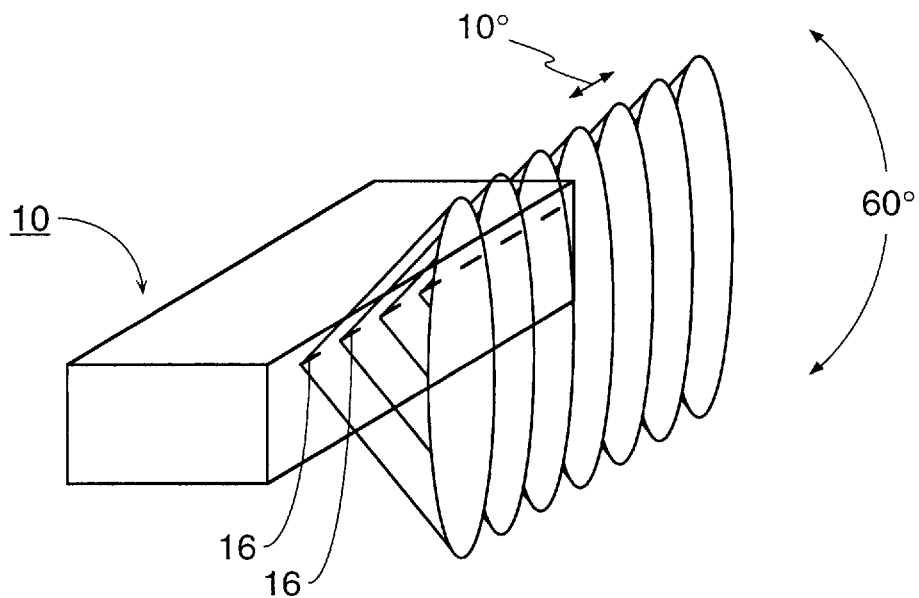
FIG. 2 is an isometric view of the optical emission pattern from the diode bar of FIG. 1.
Figure 3:
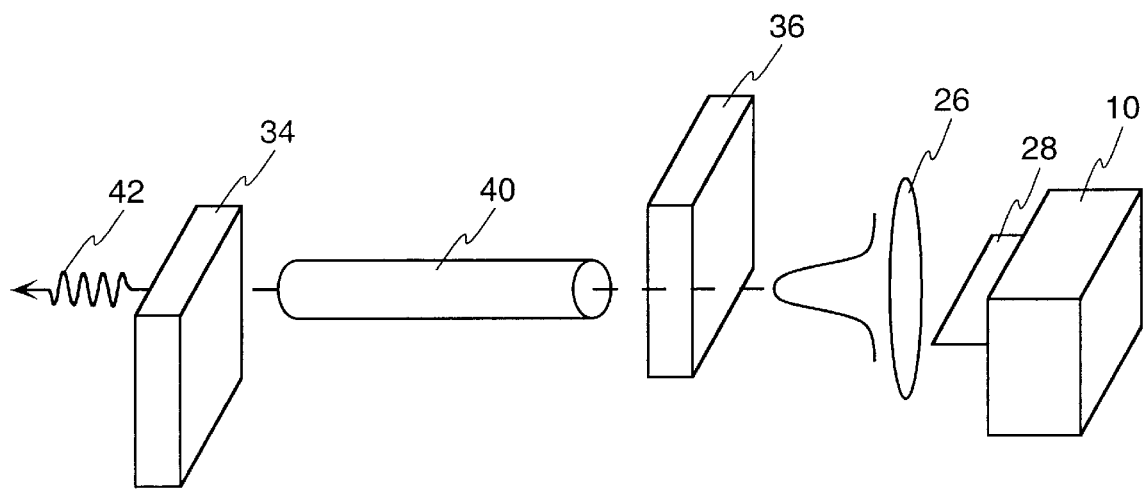
FIG. 3 is an isometric view of an end-pumped laser of the prior art.
Figure 4:
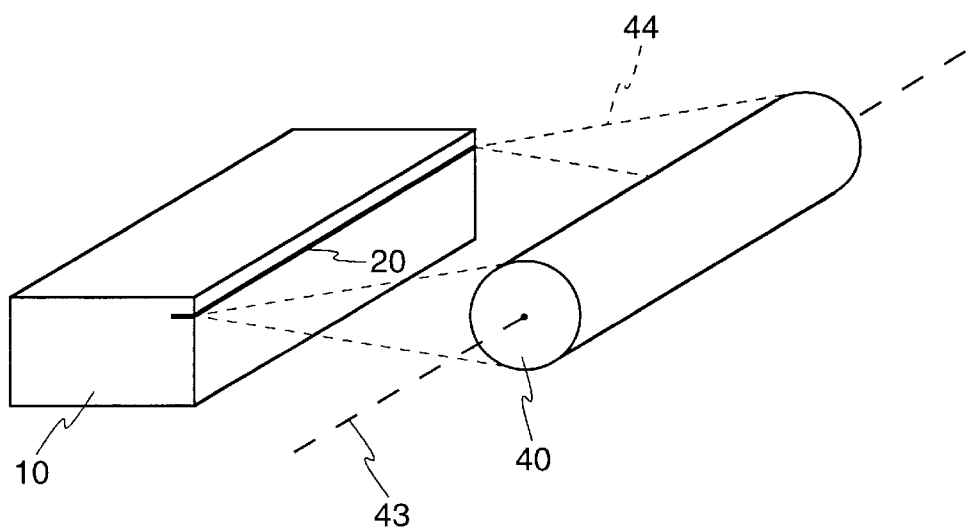
FIG. 4 is an isometric view of a side-pumped laser of the prior art.

The slab waveguide offers a number of advantages for the side-pumped laser using a heat-sunk laser rod. It allows the slit 122 to be extended considerably deeper than in the structure of FIG. 5 in which the slit 54 is empty. Although the empty slit 54 can be polished and gold-plated, doing so for a long slit is difficult. In contrast, the slab waveguide 124 provides effective and substantially lossless optical waveguiding over long distances. A deep slit 122 is desired to provide more isotropic heat sinking between the laser rod 40, 60 and the heat sink 120. An optical waveguide of high refractive index transmits light at lower loss than does a reflectively coated slit. Hence, the length of the slab waveguide 124 can be substantially increased, and the coupling efficiency can be increased. The preferred optical glass of the slab waveguide 124 has a relatively high refractive index and a low absorptivity. Because of the high refractivity, the relatively large 60° vertical divergence angle of the emission radiation of the bar laser 10 (see FIG. 2) is commensurately reduced on its travel to the laser rod 40, 60. Furthermore, the outer end 126 of the slab waveguide 124 may project beyond the face 128 of the heat sink to be in close opposition to the laser bar emission line 36. As a result, even though the slab waveguide may 124 may be relatively thin, its end 126 may be placed close enough to the emission bar 36 that the entire 60° vertically dispersed emission beam falls upon and is coupled into the slab waveguide 124. For all these reasons, the slab waveguide provides superior and more efficient coupling of the pump light into the laser rod.

The slab waveguide is advantageously combined with the previously described beam shaping. Conventionally, lenses have been used to focus the diode bar output deep within the slit adjacent to the laser rod, but this design constrains the shape of the beam initially irradiating the rod and thus constrains the shaping of the pump field. Brewster-angle beam shaping is preferred, which produces a fixed ellipticity e within the rod. The slab waveguide provides the freedom to use additional optics between the diode bar and the entrance to the slab waveguide to adjust the beam divergence within the slab and onto the laser rod so as to tailor the pump field to the elliptical or otherwise-shaped laser beam in the rod.

In an alternate embodiment, the glass slab waveguide is not used, and the opening of the slit 122 in the heat sink 120 is left empty or filled with any transparent medium. This configuration is slightly simpler in construction, and is thought to afford slightly lower performance. The pump light still enters the reflective heat sink of the laser rod very efficiently, where it is reflected back and forth until the pump light is either lost back through the slit or is absorbed by the laser rod or the imperfectly reflective walls of the heat sink.

EXAMPLE 1

Figure 17:
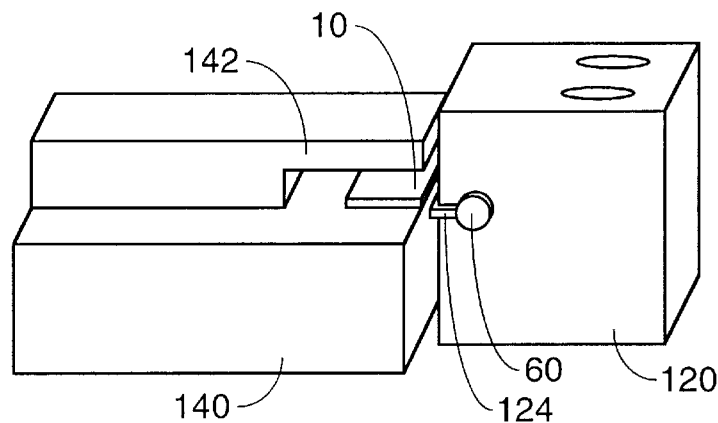
FIG. 17 is an isometric view of laser engine of the invention incorporating a slab waveguide for coupling pump light into the heat-sunk laser rod.

In one example of the invention, illustrated orthographically in FIG. 17, the diode bar 28 is supported on and electrically contacted to a heat-sinking anode 140 while a cathode 142 is electrically contacted to the other face of the diode bar 10 by unillustrated electrical lines. The diode bar 10 may be SDL Model 3470-S, available from SDL, Inc. of San Jose, Calif. It produces 20 W of pumping power in a 1 cm long stripe 36. This output is introduced to a slab waveguide 124 made of a convenient glass material such as Schott F2, which exhibits a refractive index n of 1.6. The waveguide dimensions present an aperture to the diode light of 200 $\mu$m high by greater than 1 cm long. The slab waveguide is approximately 1 mm long extending into the slit and projecting outwardly from it. The heat sink mounting the laser rod is made from copper and is gold-plated for reflectivity on the surface surrounding the rod. The rod dimensions are 1.6 mm in diameter and 18 mm long, with the end surfaces cut and polished to be used at Brewster's angle. The barrel surface of the rod has an inspection polish (visually smooth but microscopic scratches may remain) to minimize scattering of the pump light from the desired elliptical region. Alternatively, a refractive index-matching fluid could be used to mitigate the scattering effects of the ground rod surface. The heat sink also contains a slit which accommodates the glass waveguide such that the diode light is incident onto the side of the laser rod.

The Brewster's angle faces of the rod are rotated such that the plane of polarization for the lasing light lies in the plane of the diode emission. Hence, the diode light, the lasing polarization, and the Brewster's angle of the facet all lie in the same plane. This engine is used to provide optical gain to create a laser or an optical amplifier.

A simple optical cavity for a laser oscillator is formed by two end mirrors, one highly reflecting and one partially reflecting, is used to produce an output beam that is both linearly polarized and TEM$_{00}$. A typical cavity for these rod dimensions are flat mirrors spaced approximately 4 cm from the ends of the rod. With the diode laser delivering 20 W of CW pump power, a typical performance of 6 W of output laser power has been observed when the laser rod is made from Nd:YAG. In some tests, conversion efficiencies of up to 33% have been measured. This level of performance exceeds all other side-pumping geometries in efficiency known to date, and is comparable to most end-pumping geometries at this power level. This CW efficiency of 33% should be compared to the pulsed efficiency of 27% in Ajer et al. Choice of rod diameter and cavity design can ensure a round, stigmatic (circular) output beam even though the cavity is comprised of astigmatic elements and thermal lenses.

In an extension of the previous embodiments, the length of a laser rod within a heat sink may be extended such that more than one diode laser bar can be used to pump the laser crystal rod. In this embodiment, additional units are placed in optical alignment to increase the number of laser chips in the laser cavity, hence increasing the power of the output accordingly. Although it is possible to place more than one laser bar within a single laser engine, it is preferable to provide multiple laser engines each having its own laser bar, as Kmetec has described in the cited patent. Also, similarly to some of the embodiments of Kmetec, a single laser rod can be lengthened to extend through multiple laser engines.

Figure 18:
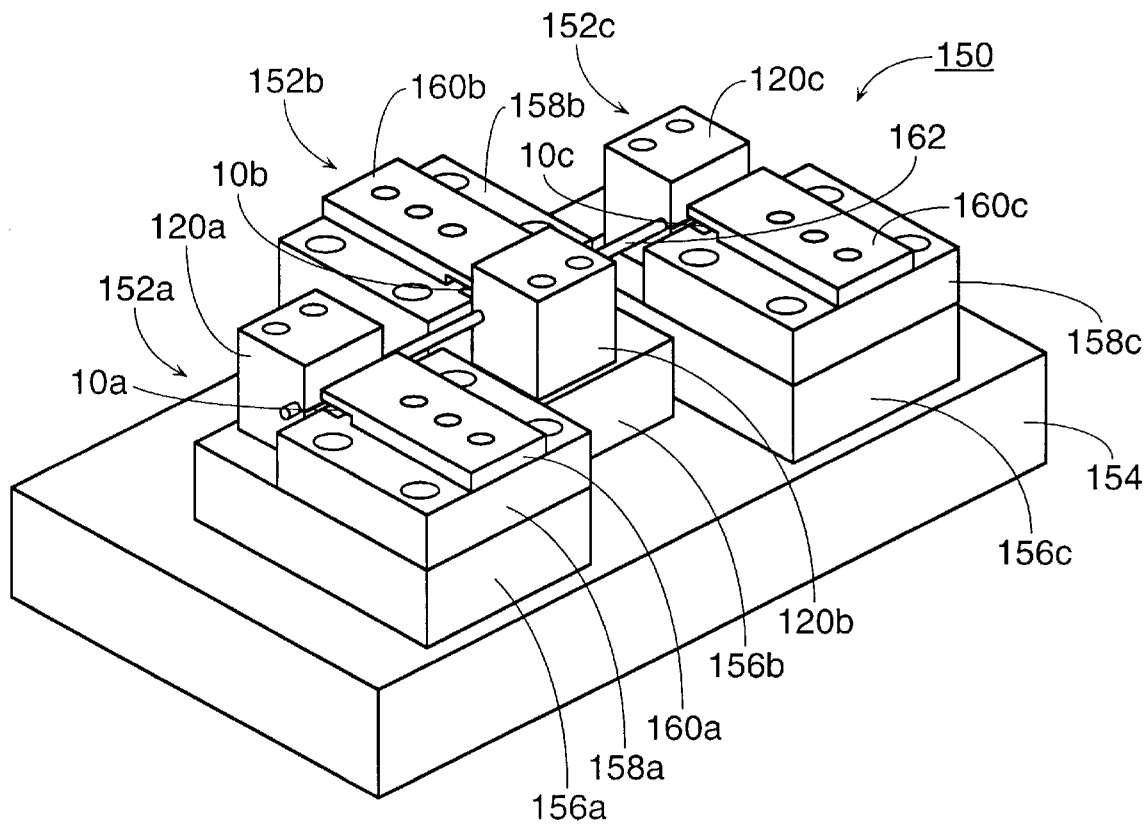
FIG. 18 is an isometric view of a three-stage laser engine of the invention.

An embodiment of a multi-engine laser system 150 is illustrated isometrically in FIG. 18. Three laser engines 152a, 152b, 152c are mounted on a common system base 154. Each laser engine 152a, 152b, 152c includes a base 156a, 156b, 156c, an anode 158a, 158b, 158c, and a laser bar 10a, 10b, 10c sandwiched therebetween by a cathode 160a, 160b, 160c. A single laser rod 162 having Brewster-angled ends passes through respective heat sinks 120a, 120b, 120c in the three engines 152a, 152b, 152c and is free-standing between them. The single rod 162 reduces facet loss on coupling between different engines. Although not clearly illustrated, each engine 152a, 152b, 152c includes a respective slab waveguide to couple light into the laser rod 162. The emission directions of the three laser bars 10a, 10b, 10c are aligned with the angled direction of the two ends of the Brewster-angled rod 162. However, the middle engine 152b is aligned anti-parallel to the end engines 152a, 152c. This orientation is to be contrasted with the previous preferred orientations involving 60° or 90° displacements intended to circularize the pump field. In contrast, here the pump field is intended to predominantly extend parallel to the plane of the system base 154. This anti-parallel planar construction is simpler than the three-dimensional orientations suggested in the prior art.

This multi-engine embodiment has been demonstrated for both two and three laser engines, where one rod spanned the distance of multiple engines. This arrangement increases the output power of the laser without adding an additional laser rod. It also insures optimal alignment of the multiple gain regions with the laser cavity. This concept can be extended to include any number of pumping units, limited only by the available length of laser crystal to span the separate heat sinks.

It has been demonstrated that two pumping units in a simple two-mirror resonator produce 12 to 13 W of circularly shaped, diffraction-limited, polarized output power, while three pumping units in a similar cavity produce 18 W. Clearly, this structure can be extended to more pumping units, either in a contiguous laser rod, or as separate laser rods with an optical alignment between them.

Alternatively, the separate heat sinks 120a, 120b, 120c could be fabricated in a single integral piece, which serves to accommodate one or more diode pump lasers. Ideally, all the pump diode laser would be situated in a plane, so that all of their emissions create elliptical gain regions which are spatially aligned. The diodes can either pump on both sides of the rod, alternatively, or they can be positioned to always pump the same side of the rod.

These experimentally tested embodiments of larger systems show many of the advantages of beam shaping optics for side-pumped lasers. The diode bars can be added one by one in an incremental fashion to satisfy the system pumping requirements. There is no need to add three at a time to circularize the pump field. Further, the laser bars can all be aligned within the same plane or close to it, either in parallel or anti-parallel, thus providing a compact, simple mechanical arrangement. There is no need to position some of the laser bars 60° or 90° out of the plane to symmetrize the system. Yet further, the Brewster-angle optics provide the simultaneous further advantages of low coupling loss and polarization selectivity.

The invention can be advantageously applied to many structures related to those described above. For example, the lasing body need not be a cylindrical rod but may have a rectangular or other cross section. The heat sink may be formed of more than one piece and then fixed together to enclose the rod in opposed depressions in multiple pieces.

Although the embodiments described above have emphasized laser oscillators, the invention may also be applied to optical amplifiers in which an input laser beam, typically modulated according to some data or pulsing scheme, is passed through an optically pumped laser rod or other optically active body. Typically, no optical cavity is formed at the ends of the rod so no mirrors are needed. In this case, the input beam is shaped to conform to the generally elliptical gain region, and the output beam may be shaped if a circular output is desired. An optical amplifier has been tested with the beam shaping of the invention. When the Nd:YAG rod was pumped with 20 W of optical power, an optical input signal was amplified 2 dB per pass of the rod.

The beam shaping of the invention provides efficient coupling between the diode pump light and the laser beam, particularly in a heat sunk structure while also capable of outputting a fundamental circular beam with the addition of a simple, passive part.

The waveguide slab of the invention further increases the efficient coupling of the laser diode radiation with the active laser rod.

What is claimed is:

1. A side-pump laser system, comprising:
   a substantially cylindrical laser rod extending along an axis;
   a source of optical pump light comprising an array of light emitting diodes extending along said axis and aligned to strike a side of said laser rod along an incidence direction, wherein no focusing optics are disposed between said array of light emitting diodes and said laser rod; and
   at least one beam shaper associated with a respective end of said laser rod to extend a first dimension of a beam propagating external of said rod to a second dimension along said incidence direction within said rod, said extending of said first dimension being performed relative to a third dimension of said beam propagating external of said rod substantially perpendicular to said first dimension corresponding to a fourth dimension of said beam within said rod by said beam shaper.

2. The side-pump laser system of claim 1, wherein said beam shaper can convert a circular beam external of said rod to an substantially elliptical beam within said rod having an ellipticity ratio of greater than 1 and less than 3.

3. A side-pumped laser system, comprising:
   a substantially cylindrical laser rod extending along an axis;
   a source of optical pump light emitting a beam of light extending along said axis and aligned to strike a side of said laser rod along an incidence direction; and
   at least one beam shaper comprising at least one end of said laser rod being inclined at a non-perpendicular angle with respect to said axis of said rod to extend a first dimension of a beam propagating external of said rod to a second dimension along said incidence direction within said rod, said extending of said first dimension being performed relative to a third dimension of said beam propagating external of said rod substantially perpendicular to said first dimension corresponding to a fourth dimension of said beam within said rod by said beam shaper.

4. The side-pumped laser system of claim 3, wherein said non-perpendicular angle corresponds to a Brewster angle.

5. A side-pumped laser system, comprising:
   a substantially cylindrical laser rod extending along an axis;
   a source of optical pump light emitting a beam of light extending along said axis and aligned to strike a side of said laser rod along an incidence direction; and
   at least one beam shaper associated with a respective end of said laser rod to extend a first dimension of a beam propagating external of said rod to a second dimension along said incidence direction within said rod, said extending of said first dimension being performed relative to a third dimension of said beam propagating external of said rod substantially perpendicular to said first dimension corresponding to a fourth dimension of said beam within said rod by said beam shaper and, said extending of said first dimension causing said beam to be more elliptically shaped in said rod than on a side of said beam shaper opposite said rod.

6. The side-pump laser system of claim 5, wherein said beam shaper can convert a circular beam external of said rod to an substantially elliptical beam within said rod having an ellipticity ratio of greater than 1 and less than 3.

7. The side-pumped laser system of claim 5, wherein said beam shaper comprises a prism.

8. The side-pumped laser system of claim 7, wherein said prism has an apex angle corresponding to use at a Brewster angle.

9. The side-pumped laser system of claim 5, wherein said beam shaper comprises anamorphic refractive optics.

10. The side-pumped laser system of claim 5, wherein said beam shaper comprises anamorphic reflective optics.

11. The side-pumped laser system of claim 5, wherein said rod has a cylindrical cross section.

12. The side-pumped laser system of claim 5, further comprising a heat sink having an internal aperture into which said rod is closely fit and having a slit extending from an external face of said heat sink to said aperture and aligned with said beam of said optical pump light.

13. The side-pumped laser system of claim 12, further comprising a slab waveguide fit into said slit.

14. The side-pumped laser system of claim 13, wherein said slab waveguide extends outwardly of said external face of heat sink.

15. The side-pumped laser system of claim 12, wherein sides of said aperture are coated with a reflective coating.

16. The side-pumped laser system of claim 5, further comprising a pair of reflective surfaces forming an optical cavity along a path including said laser rod.

17. The side-pumped laser system of claim 16, wherein said beam shaper is disposed along said path within said optical cavity.

18. The side-pumped laser system of claim 16, wherein said beam shaper is disposed outside of said optical cavity.

19. The side-pumped laser system of claim 16, wherein one of said pair of reflective surfaces is a coating applied to a substantially perpendicular end of said rod.

20. A side-pumped laser system, comprising:
   a substantially cylindrical laser rod extending along an axis and having at least one end being inclined along a first direction at an angle corresponding to the Brewster angle with respect to a longitudinal axis of said rod; and
   a source of optical pump light emitting a beam of light aligned along said first direction to strike a cylindrical side of said laser rod.

* * * * *